(12) United States Patent
Maeda et al.

(10) Patent No.: US 9,530,695 B2
(45) Date of Patent: Dec. 27, 2016

(54) WAFER PROCESSING METHOD

(71) Applicant: DISCO CORPORATION, Tokyo (JP)

(72) Inventors: Tsutomu Maeda, Tokyo (JP); Satoshi Genda, Tokyo (JP)

(73) Assignee: Disco Corporation, Tokyo (JP)

( * ) Notice: Subject to any disclaimer, the term of this patent is extended or adjusted under 35 U.S.C. 154(b) by 294 days.

(21) Appl. No.: 14/503,967

(22) Filed: Oct. 1, 2014

(65) Prior Publication Data

US 2015/0096964 A1    Apr. 9, 2015

(30) Foreign Application Priority Data

Oct. 3, 2013    (JP) .................................. 2013-208400

(51) Int. Cl.
| | |
|---|---|
| H01L 21/30 | (2006.01) |
| B23K 26/00 | (2014.01) |
| B23K 26/53 | (2014.01) |
| H01L 21/78 | (2006.01) |
| H01L 21/304 | (2006.01) |
| H01L 21/67 | (2006.01) |

(52) U.S. Cl.
CPC .......... *H01L 21/78* (2013.01); *B23K 26/0057* (2013.01); *B23K 26/53* (2015.10); *H01L 21/3043* (2013.01); *H01L 21/67092* (2013.01); *H01L 21/67132* (2013.01)

(58) Field of Classification Search
CPC ............. H01L 21/3043; B23K 26/0057; B23K 26/359; B23K 26/53
USPC ........ 438/460, 462–464; 219/121.69, 121.84
See application file for complete search history.

(56) References Cited

U.S. PATENT DOCUMENTS

2007/0111390 A1*   5/2007   Komura ............. B23K 26/0057
                                                       438/113

FOREIGN PATENT DOCUMENTS

JP        2011-166002          8/2011

* cited by examiner

*Primary Examiner* — Samuel M Heinrich
(74) *Attorney, Agent, or Firm* — Greer Burns & Crain, Ltd.

(57) ABSTRACT

A wafer processing method includes a wafer unit forming step of supporting a wafer through an adhesive tape to an annular frame to thereby form a wafer unit, a wafer unit holding step of holding the wafer through the adhesive tape on a holding surface of a chuck table under suction, a processing step of applying a laser beam to the wafer held on the chuck table to thereby form a modified layer inside the wafer, an unloading step of unloading the wafer unit from the chuck table, and a dividing step of dividing the wafer along the modified layer as a division start point. The wafer processing method further includes a close contact canceling step of blowing a fluid from the holding surface against the adhesive tape after performing the processing step to thereby cancel the close contact between the adhesive tape and the holding surface.

2 Claims, 6 Drawing Sheets

WAFER PROCESSING METHOD

BACKGROUND OF THE INVENTION

1. Field of the Invention

The present invention relates to a wafer processing method.

2. Description of the Related Art

In a semiconductor device fabrication process, a plurality of devices such as ICs, LSIs, and MEMS (Micro Electro Mechanical Systems) devices are formed on the front side of a substantially disk-shaped semiconductor wafer. These plural devices are formed in a plurality of separate regions defined by a plurality of crossing division lines called streets. The semiconductor wafer thus having the plural devices is cut along the streets to thereby divide the plural separate regions where the plural devices are formed from each other. Thus, a plurality of device chips corresponding to the plural devices are manufactured.

Until recent years, cutting of the semiconductor wafer has been performed by using a cutting apparatus having a cutting blade. However, since a division groove having a width of about 20 to 40 µm is formed along each division line by the cutting blade, each division line must have a sufficient width to cause a problem such that the number of devices that can be obtained is limited. Furthermore, since the semiconductor wafer is cut by the cutting blade as supplying a cutting water to remove dust, there is a possibility that the MEMS devices may be damaged by the scattering of the cutting water. Further, cutting of a low-k film without separation is difficult in the case of using the cutting apparatus. For these reasons, a laser processing apparatus using a laser beam has been increasingly applied to the processing of the semiconductor wafer.

SUMMARY OF THE INVENTION

In the cutting apparatus or laser processing apparatus, the wafer is often processed in the condition of a wafer unit such that the wafer is fixed through an adhesive tape (dicing tape) to an annular frame. The wafer of the wafer unit is held under suction through the adhesive tape on a holding surface of a chuck table. At this time, there is a case that the adhesive tape may come into close contact with the holding surface having fine asperities and that the wafer may be forcibly separated from the holding surface in unloading the wafer from the chuck table. Particularly in the case that a modified layer is formed inside the wafer along each division line by using a laser beam, there is a possibility that the wafer may be unintentionally cracked.

It is therefore an object of the present invention to provide a wafer processing method which can prevent unintentional cracking of a wafer in which a modified layer has already been formed along each division line.

In accordance with an aspect of the present invention, there is provided a wafer processing method of processing a wafer having a plurality of devices formed on the front side of the wafer, the devices being formed in a plurality of separate regions defined by a plurality of crossing division lines, the wafer processing method including a wafer unit forming step of supporting an adhesive tape to an annular frame so that the inner opening of the annular frame is closed by the adhesive tape and attaching the wafer to the adhesive tape supported to the annular frame in the condition where the back side of the wafer is exposed, thereby forming a wafer unit including the wafer, the adhesive tape, and the annular frame; a wafer unit holding step of holding the wafer of the wafer unit through the adhesive tape on a holding surface of a chuck table under suction; a processing step of applying a laser beam having a transmission wavelength to the wafer held on the holding surface of the chuck table along each division line to thereby form a modified layer inside the wafer along each division line; a close contact canceling step of blowing a fluid from the holding surface against the adhesive tape after performing the processing step to thereby cancel the close contact between the adhesive tape and the holding surface; an unloading step of unloading the wafer unit from the chuck table by using transfer means for holding the annular frame to transfer the wafer unit after performing the close contact canceling step; and a dividing step of applying an external force to the wafer of the wafer unit after performing the unloading step to thereby divide the wafer along each division line where the modified layer has been formed as a division start point.

Preferably, the annular frame is fixed at a vertical position lower than that of the holding surface of the chuck table in the wafer unit holding step; and the close contact canceling step is performed after raising the annular frame to a vertical position higher than that of the holding surface.

In the wafer processing method according to the present invention, a fluid is blown from the holding surface of the chuck table against the adhesive tape in order to cancel the close contact between the adhesive tape and the holding surface. Accordingly, it is possible to prevent cracking of the wafer due to forcible separation of the wafer from the holding surface. That is, it is possible to prevent unintentional cracking of the wafer in which the modified layers have already been formed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be various omitted, replaced, or changed without departing from the scope of the present invention.

Figure 1A:
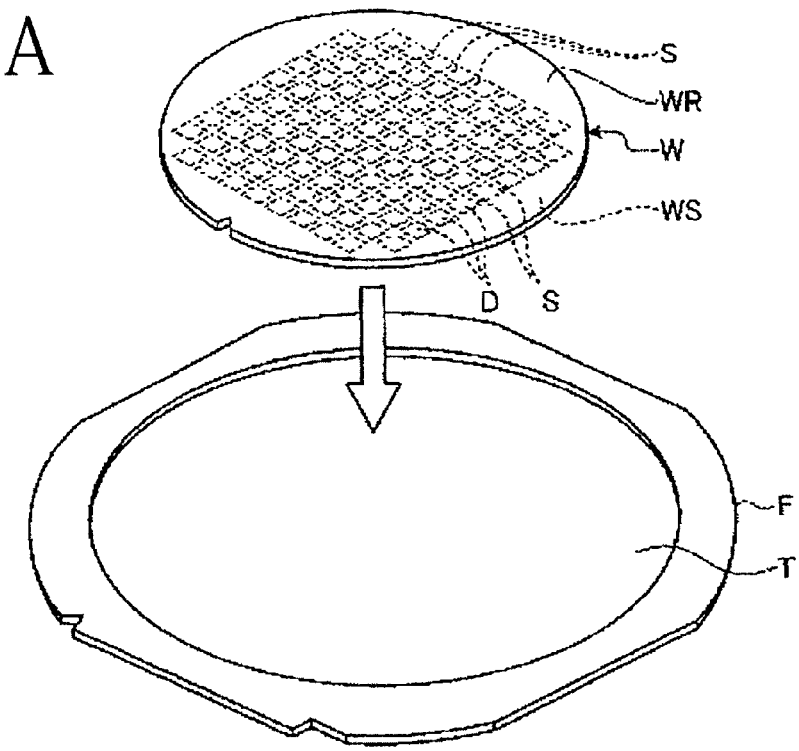
FIG. 1A is a perspective view showing a wafer to be processed by a wafer processing method according to a preferred embodiment of the present invention.

A wafer processing method according to this preferred embodiment will now be described with reference to FIGS. 1A to 6B. The wafer processing method (which will be hereinafter referred to simply as processing method) according to this preferred embodiment is a method of processing a wafer W shown in FIG. 1A. More specifically, the processing method according to this preferred embodiment is a method of applying a laser beam L (see FIG. 3) to the wafer W to form a modified layer K (see FIG. 3) inside the wafer W and next dividing the wafer W into individual device chips DT (see FIG. 6B). The wafer W as a workpiece to be divided into the individual device chips DT by the processing method according to this preferred embodiment is a disk-shaped semiconductor wafer or optical device wafer formed from a substrate of silicon, sapphire, or gallium arsenide, for example. As shown in FIG. 1A, the wafer W has a front side WS and a back side WR. A plurality of crossing division lines S are formed on the front side WS of the wafer W to thereby define a plurality of separate regions where a plurality of devices D are formed. These plural devices D constitute the individual device chips DT. Examples of each device D include an IC (Integrated Circuit), LSI (Large-Scale Integrated circuits), and MEMS (Micro Electro Mechanical Systems) device. Further, a surface film such as a low-permittivity insulator film (low-k film) is formed on the front side WS of the wafer W. Examples of the low-k film include an inorganic film of SiOF, BSG (SiOB), etc. and an organic film such as a polymer film of polyimide, parylene, etc.

The modified layer K means a region different from its surrounding region in density, refractive index, mechanical strength, or any other physical properties. Examples of this region include a melted region, cracked region, breakdown region, refractive index changed region, and their mixed region. The processing method according to this preferred embodiment includes at least a wafer unit forming step, wafer unit holding step, processing step, unloading step, and dividing step.

Figure 1B:
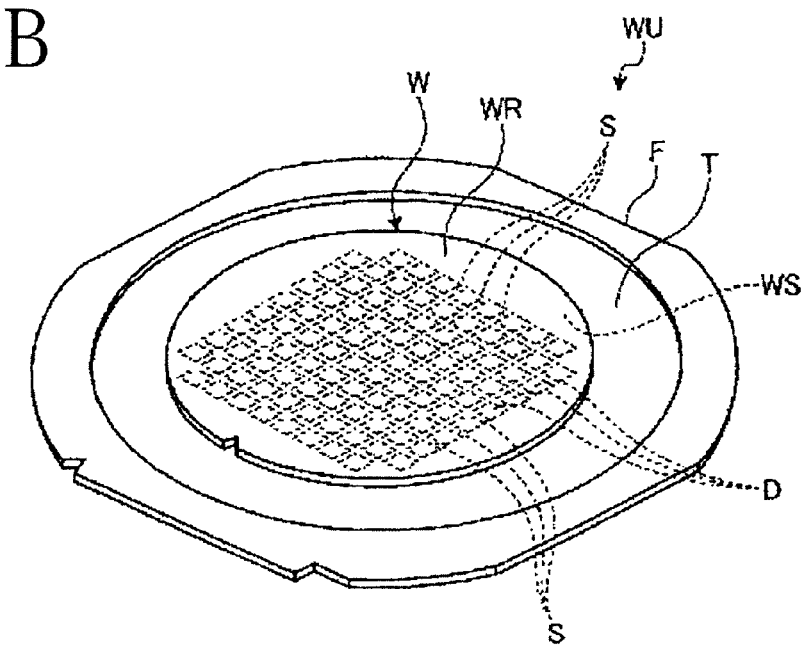
FIG. 1B is a perspective view of a wafer unit formed by a wafer unit forming step.

The wafer unit forming step is performed in the following manner as shown in FIGS. 1A and 1B. An adhesive tape T is preliminarily supported to an annular frame F so as to close the inner opening of the annular frame F. The wafer W is attached to the adhesive tape T supported to the annular frame F in the condition where the back side WR of the wafer W is exposed, thus forming a wafer unit WU including the wafer W, the adhesive tape T, and the annular frame F as shown in FIG. 1B. The wafer unit forming step is followed by the wafer unit holding step.

Figure 2A:
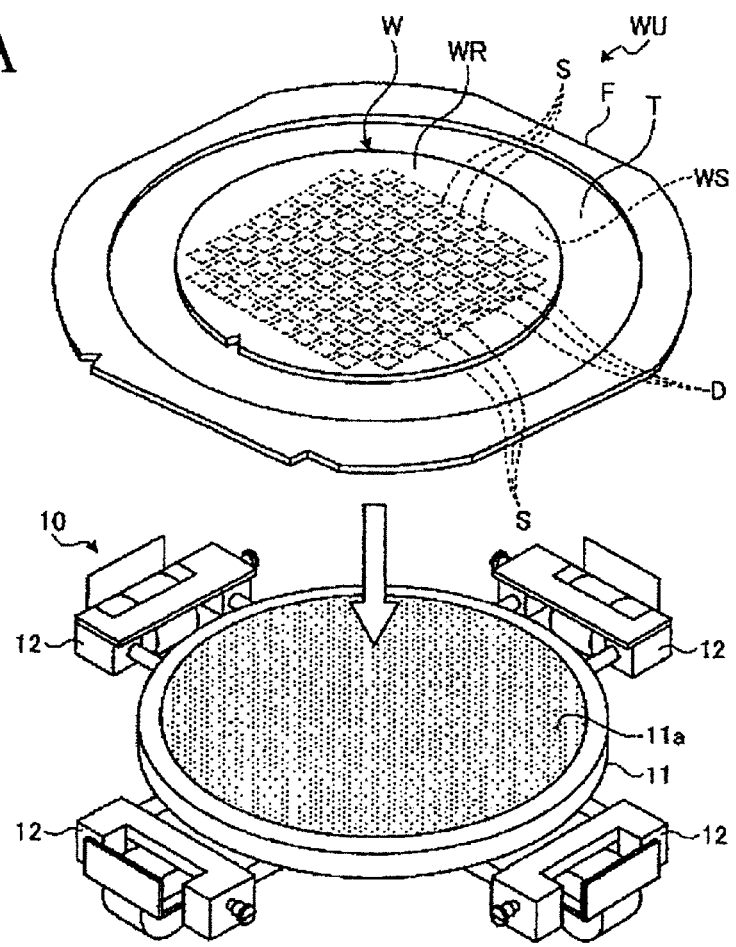
FIG. 2A is a perspective view showing a chuck table having a holding surface to be used in performing a wafer unit holding step.
Figure 2B:
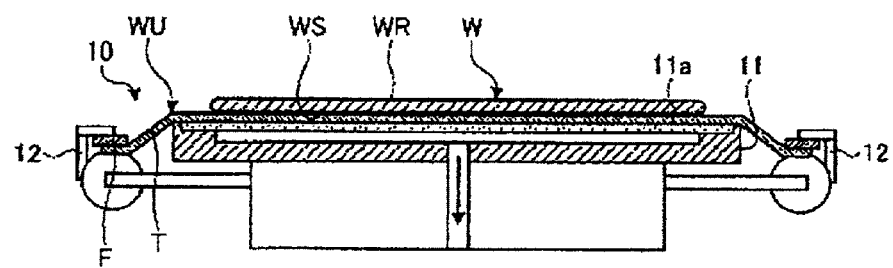
FIG. 2B is a sectional view of the wafer unit held on the chuck table by the wafer unit holding step.

The wafer unit holding step is performed in the following manner as shown in FIGS. 2A and 2B. Referring to FIG. 2A, there is shown a chuck table 11 included in a laser processing apparatus 10 for applying the laser beam L (see FIG. 3) to the wafer W. The chuck table 11 has a porous holding surface 11a for holding the wafer W thereon. The porous holding surface 11a of the chuck table 11 is connected through a suction passage (not shown) to a vacuum source for generating a vacuum. As shown in FIGS. 2A and 2B, the wafer W of the wafer unit WU is placed on the holding surface 11a of the chuck table 11 through the adhesive tape T. In this condition, the vacuum generated in the vacuum source is applied through the suction passage to the holding surface 11a of the chuck table 11, thereby holding the front side WS of the wafer W of the wafer unit WU through the adhesive tape T on the holding surface 11a of the chuck table 11 under suction. Further, a plurality of clamps 12 are provided around the chuck table 11 at a vertical position lower than that of the holding surface 11a. The clamps 12 are driven by an air actuator (not shown). In the condition where the wafer W is held through the adhesive tape T on the holding surface 11a of the chuck table 11 under suction, the annular frame F of the wafer unit WU is fixed by the clamps 12. Accordingly, the annular frame F is fixed by the clamps 12 at a vertical position lower than that of the holding surface 11a. The wafer unit holding step is followed by the processing step.

Figure 3:
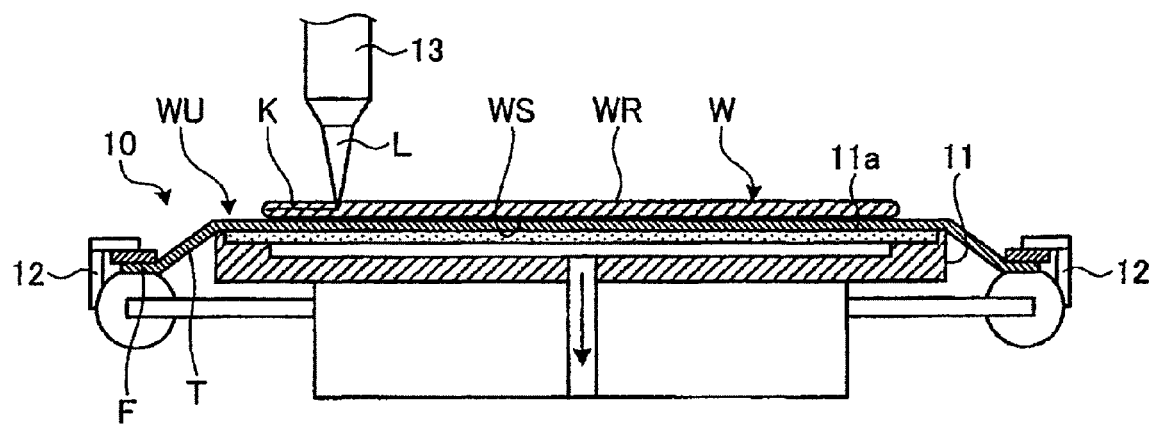
FIG. 3 is a sectional view for illustrating a processing step.

The processing step is performed in the following manner as shown in FIG. 3. First, alignment is performed according to an image obtained by imaging means (not shown) included in the laser processing apparatus 10. The laser processing apparatus 10 further includes laser beam applying means 13 for applying the laser beam L to the wafer W. The chuck table 11 and the laser beam applying means 13 are relatively moved by moving means (not shown). During this movement, the laser beam L having a transmission wavelength (e.g., 1064 nm) to the wafer W is applied from the back side WR of the wafer W held on the chuck table 11 by operating the laser beam applying means 13. The laser beam L is applied along each division line S in the condition where the focal point of the laser beam L is set inside the wafer W, thereby forming the modified layer K inside the wafer W along each division line S. In this processing step, the wafer W continues to be held on the holding surface 11a under suction by operating the vacuum source. The processing step is followed by the unloading step.

Figure 4:
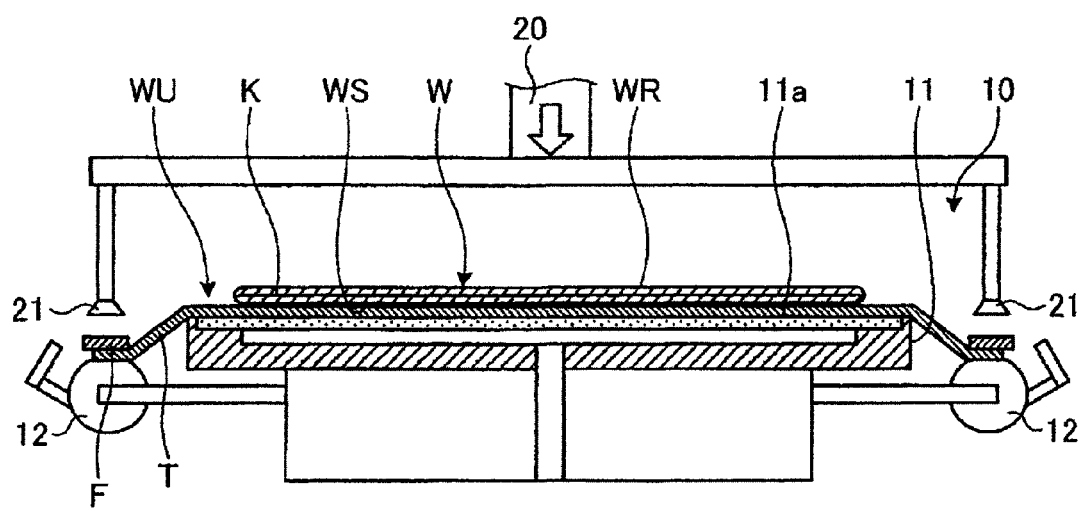
FIG. 4 is a sectional view showing a condition that transfer means is lowered to hold an annular frame constituting the wafer unit in performing an unloading step.
Figure 5A:
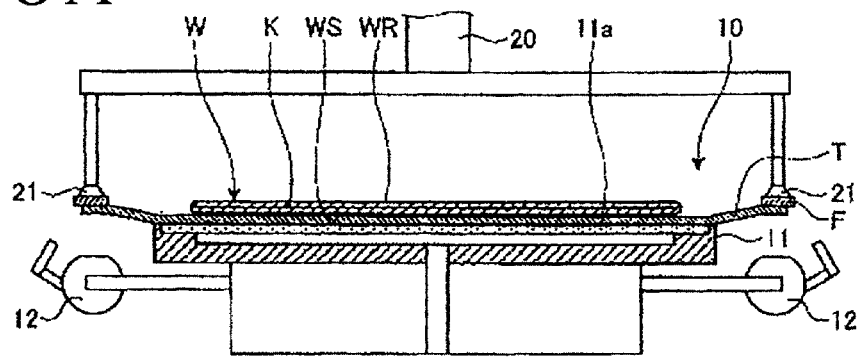
FIG. 5A is a sectional view showing a condition that the transfer means holding the annular frame is raised.

The unloading step is performed in the following manner as shown in FIG. 4 and FIGS. 5A to 5C. First, the fixation of the annular frame F by the clamps 12 is canceled and the suction holding of the wafer W by the vacuum source is also stopped as shown in FIG. 4. In FIG. 4, reference numeral 20 denotes transfer means for transferring the wafer unit WU. The transfer means 20 has a suction holding portion 21 for holding the annular frame F under suction. As shown in FIG. 4, the suction holding portion 21 of the transfer means 20 is opposed to the annular frame F. Thereafter, the transfer means 20 is lowered to bring the suction holding portion 21 into contact with the annular frame F, thereby holding the annular frame F under suction. Thereafter, as shown in FIG. 5A, the transfer means 20 is raised to raise the wafer unit WU in such a manner that the adhesive tape T is not separated from the holding surface 11a. More specifically, the transfer means 20 is raised to raise the annular frame F to a vertical position slightly higher than that of the holding surface 11a as shown in FIG. 5A. As a modification, the vacuum source may be operated to apply the vacuum to the holding surface 11a in holding the annular frame F with the suction holding portion 21 and raising the annular frame F.

Figure 5B:
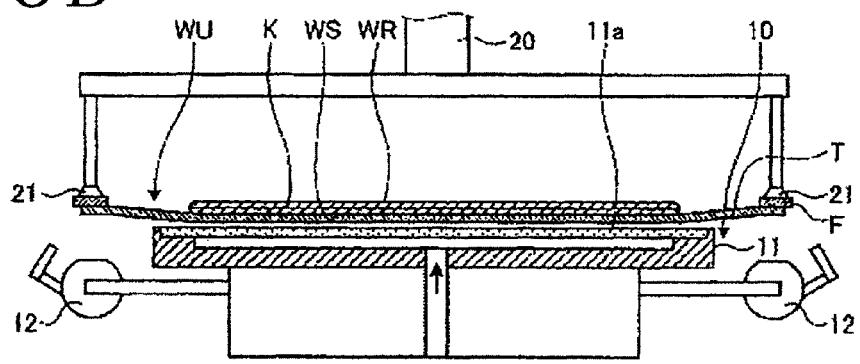
FIG. 5B is a sectional view showing a condition that a fluid is blown from the holding surface of the chuck table.
Figure 5C:
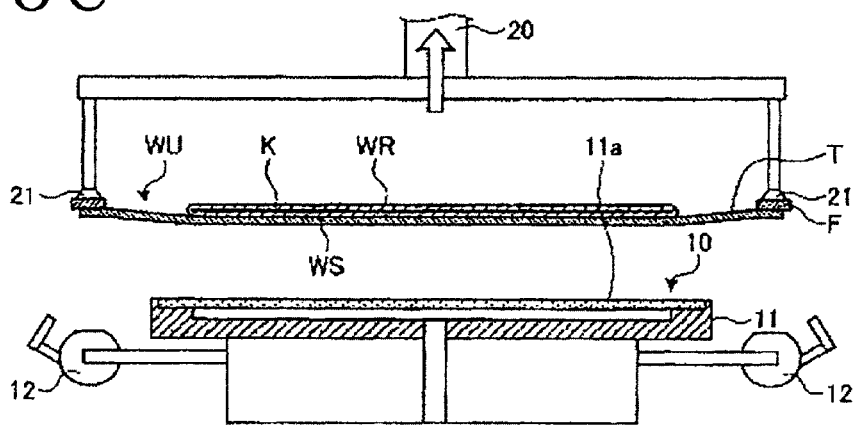
FIG. 5C is a sectional view showing a condition that the transfer means is further raised to unload the wafer unit from the chuck table.

A fluid source (not shown) is connected to the holding surface 11a of the chuck table 11, so as to supply a gas as a fluid under pressure to the holding surface 11a. Accordingly, by supplying the gas under pressure from the fluid source to the holding surface 11a, the close contact between the adhesive tape T and the holding surface 11a is canceled as shown in FIG. 5B (close contact canceling step). In this close contact canceling step, the adhesive tape T is spaced from the holding surface 11a in parallel relationship thereto. Thereafter, as shown in FIG. 5C, the transfer means 20 is raised to transfer the wafer unit WU from the chuck table 11. As a modification, a liquid as the fluid may be supplied under pressure in place of the gas in the close contact canceling step. As another modification, both the gas and the liquid may be supplied simultaneously under pressure in the close contact canceling step. The unloading step is followed by the dividing step.

Figure 6A:
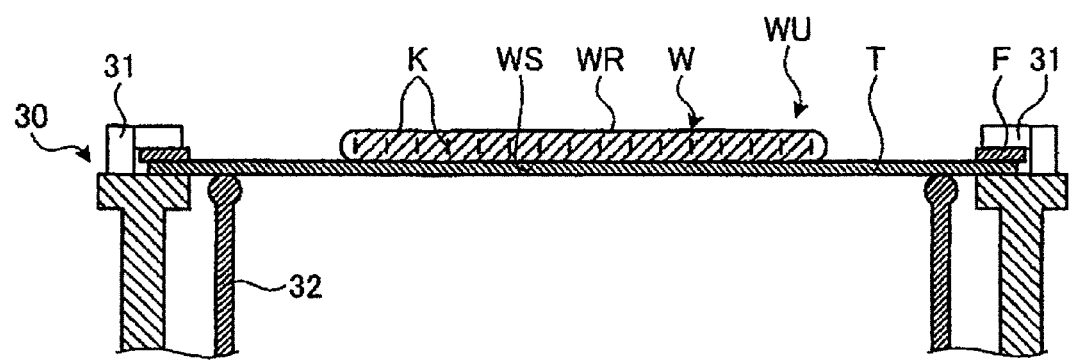
FIG. 6A is a sectional view showing a dividing apparatus to be used in performing a dividing step.
Figure 6B:
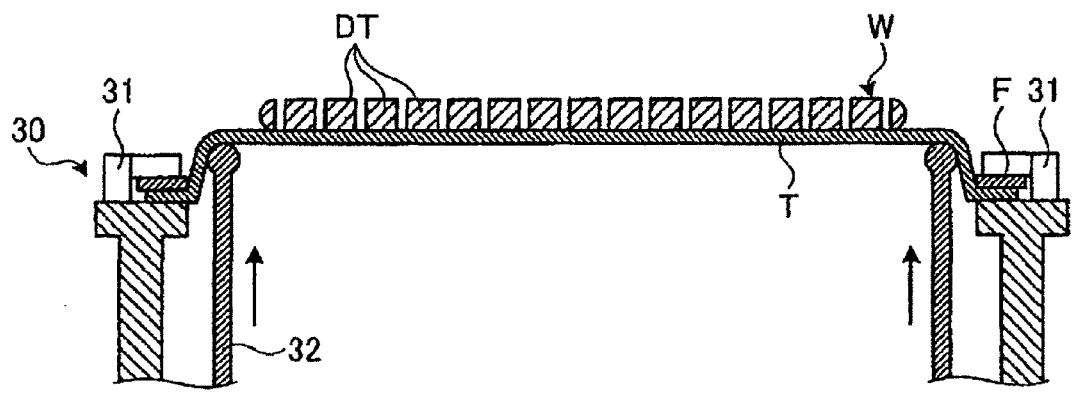
FIG. 6B is a sectional view showing a condition that the wafer is divided by the dividing step.

The dividing step is performed in the following manner as shown in FIGS. 6A and 6B. The wafer unit WU is transferred to a dividing apparatus 30 by the transfer means 20. The dividing apparatus 30 includes clamps 31 for holding the annular frame F and a vertically movable pressure member 32 for applying a pressure to the adhesive tape T. As shown in FIG. 6A, the annular frame F is fixed by the clamps 31 of the dividing apparatus 30, and the upper end of the pressure member 32 is brought into contact with the lower surface of the adhesive tape T. Thereafter, as shown in FIG. 6B, the pressure member 32 is raised to expand the adhesive tape T in the radial direction thereof, thereby applying an external force to the wafer W attached to the adhesive tape T in the radially outward direction thereof. As a result, the wafer W is divided along the division lines S where the modified layers K are formed as division start points, thereby obtaining the individual device chips DT. Thereafter, each device chip DT is peeled from the adhesive tape T and next transferred to a required stage.

In the processing method according to this preferred embodiment, the close contact canceling step is performed to cancel the close contact between the adhesive tape T of the wafer unit WU and the holding surface 11a of the chuck table 11 by supplying a gas as a fluid under pressure to the holding surface 11a, i.e., by blowing the gas from the holding surface 11a against the adhesive tape T. Accordingly, it is possible to prevent cracking of the wafer W due to forcible separation of the wafer W from the holding surface 11a. That is, it is possible to prevent unintentional cracking of the wafer W in which the modified layers K have already been formed.

Further, in the wafer unit holding step, the annular frame F is usually fixed at a vertical position lower than that of the holding surface 11a in order to avoid possible collision of the clamps 12 with the laser beam applying means 13. However, if a large amount of pressurized gas is blown from the holding surface 11a against the adhesive tape T in the vertical position of the annular frame F lower than that of the holding surface 11a in the close contact canceling step, the adhesive tape T attached to the wafer W may be expanded like a dome (hemisphere). At this time, there is a possibility that the wafer W in which the modified layers K have been formed to cause easy break may be cracked with unintentional timing in unintentional directions.

To cope with this problem, the annular frame F is preliminarily raised to the position higher than that of the holding surface 11a in performing the close contact canceling step after forming the modified layers K. As a result, it is possible to prevent the problem that the adhesive tape T may be deformed like a dome to cause warpage of the wafer W and cracking of the wafer W with unintentional timing in unintentional directions.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer having a plurality of devices formed on a front side of said wafer, said devices being formed in a plurality of separate regions defined by a plurality of crossing division lines, said wafer processing method comprising:
   a wafer unit forming step of supporting an adhesive tape to an annular frame so that the inner opening of said annular frame is closed by said adhesive tape and attaching said wafer to said adhesive tape supported to said annular frame in the condition where the back side of said wafer is exposed, thereby forming a wafer unit including said wafer, said adhesive tape, and said annular frame;
   a wafer unit holding step of holding said wafer of said wafer unit through said adhesive tape on a holding surface of a chuck table under suction;
   a processing step of applying a laser beam having a transmission wavelength to said wafer held on said holding surface of said chuck table along each division line to thereby form a modified layer inside said wafer along each division line;
   a close contact canceling step of blowing a fluid from said holding surface against said adhesive tape after performing said processing step to thereby cancel the close contact between said adhesive tape and said holding surface;
   an unloading step of unloading said wafer unit from said chuck table by using transfer means for holding said annular frame to transfer said wafer unit after performing said close contact canceling step; and
   a dividing step of applying an external force to said wafer of said wafer unit after performing said unloading step to thereby divide said wafer along each division line where said modified layer has been formed as a division start point.

2. The wafer processing method according to claim 1, wherein said annular frame is fixed at a vertical position lower than that of said holding surface of said chuck table in said wafer unit holding step; and
   said close contact canceling step is performed after raising said annular frame to a vertical position higher than that of said holding surface.

* * * * *